(12) United States Patent
Inomata et al.

(10) Patent No.: US 7,556,740 B2
(45) Date of Patent: *Jul. 7, 2009

(54) METHOD FOR PRODUCING A SOLAR CELL

(75) Inventors: Yosuke Inomata, Yokaichi (JP); Katsuhiko Shirasawa, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/648,429

(22) Filed: Aug. 26, 2003

(65) Prior Publication Data

US 2004/0040932 A1 Mar. 4, 2004

(30) Foreign Application Priority Data

| Aug. 27, 2002 | (JP) | ............................... 2002-247329 |
| Aug. 28, 2002 | (JP) | ............................... 2002-249673 |
| Aug. 28, 2002 | (JP) | ............................... 2002-249674 |

(51) Int. Cl.
*H01L 21/306* (2006.01)

(52) U.S. Cl. ............................... 216/45; 216/67; 216/79

(58) Field of Classification Search ........................ None
See application file for complete search history.

(56) References Cited

U.S. PATENT DOCUMENTS

| 3,982,976 | A | 9/1976 | Marciniec |
| 4,243,506 | A | 1/1981 | Ikeda et al. ............ 204/298.31 |
| 4,523,971 | A | 6/1985 | Cuomo et al. .......... 156/345.39 |
| 4,661,203 | A | 4/1987 | Smith et al. ................. 438/725 |
| 4,681,780 | A | 7/1987 | Kamman .................... 427/282 |
| 4,771,213 | A * | 9/1988 | Higashinakagawa et al. ..... 313/402 |
| 4,810,322 | A | 3/1989 | Gut et al. |
| 4,842,679 | A | 6/1989 | Kudo et al. ................. 438/707 |
| 5,015,331 | A | 5/1991 | Powell ....................... 438/723 |
| 5,171,732 | A | 12/1992 | Hed ........................... 505/190 |
| 5,177,398 | A * | 1/1993 | Engemann ............... 313/360.1 |
| 5,223,108 | A | 6/1993 | Hurwitt ................. 204/192.12 |
| 5,248,371 | A | 9/1993 | Maher et al. |

(Continued)

FOREIGN PATENT DOCUMENTS

DE  1 621 342  5/1971

(Continued)

OTHER PUBLICATIONS

Japanese language notice of rejection and its English translation for Japanese application No. 2002-249672.

(Continued)

*Primary Examiner*—Allan Olsen
(74) *Attorney, Agent, or Firm*—Hogan & Hartson LLP

(57) ABSTRACT

A substrate processing apparatus that roughens the surface of a substrate through a dry etching method by covering the surface of the substrate to be processed with a plate provided with a number of opening portions. The plate is provided with the opening portions in such a manner that an open area ratio of the opening portions on the peripheral side is smaller than an open area ratio of the opening portions in the central portion when the plate is viewed in a plane. It is thus possible to form textures on the surface of the substrate efficiently and homogenously, which in turn makes it possible to manufacture highly efficient solar cells or the like at a low cost.

20 Claims, 5 Drawing Sheets

U.S. PATENT DOCUMENTS

| | | | |
|---|---|---|---|
| 5,254,215 A | 10/1993 | Terakado et al. | 216/63 |
| 5,304,250 A | 4/1994 | Sameshima et al. | 118/723 ER |
| 5,332,464 A | 7/1994 | Namrose | 438/9 |
| 5,417,798 A | 5/1995 | Nishibayashi et al. | |
| 5,503,881 A | 4/1996 | Cain et al. | |
| 5,665,167 A | 9/1997 | Deguchi et al. | |
| 5,679,436 A | 10/1997 | Zhao | |
| 5,695,564 A * | 12/1997 | Imahashi | 118/719 |
| 5,753,014 A | 5/1998 | Van Rijn | 96/12 |
| 5,764,842 A | 6/1998 | Aoki et al. | 385/131 |
| 5,770,123 A * | 6/1998 | Hatakeyama et al. | 264/1.21 |
| 5,868,952 A * | 2/1999 | Hatakeyama et al. | 216/66 |
| 5,968,275 A | 10/1999 | Lee et al. | 118/723 R |
| 5,990,016 A | 11/1999 | Kim et al. | |
| 6,087,274 A | 7/2000 | Tonucci et al. | 438/758 |
| 6,132,805 A * | 10/2000 | Moslehi | 427/248.1 |
| 6,171,351 B1 * | 1/2001 | Schroder et al. | 51/295 |
| 6,176,967 B1 | 1/2001 | Obszarny | 156/345.3 |
| 6,214,161 B1 | 4/2001 | Becker et al. | 156/345.48 |
| 6,261,406 B1 | 7/2001 | Jurgensen et al. | 156/345.3 |
| 6,316,289 B1 | 11/2001 | Chung | 438/118 |
| 6,413,880 B1 | 7/2002 | Baski et al. | 438/759 |
| 6,418,941 B1 * | 7/2002 | Arita et al. | 134/1.2 |
| 2001/0006169 A1 | 7/2001 | Hogan et al. | |
| 2001/0036744 A1 | 11/2001 | Taravade et al. | 438/729 |
| 2002/0011215 A1 | 1/2002 | Tei et al. | |
| 2002/0168166 A1 | 11/2002 | Itoh et al. | 385/129 |
| 2005/0011447 A1 | 1/2005 | Fink | |
| 2005/0241583 A1 | 11/2005 | Buechel et al. | |
| 2005/0251990 A1 | 11/2005 | Choi et al. | |
| 2006/0060138 A1 | 3/2006 | Keller et al. | |

FOREIGN PATENT DOCUMENTS

| | | |
|---|---|---|
| EP | 0 399 998 B1 | 9/1998 |
| JP | 56-076242 | 6/1981 |
| JP | 58-032417 | 2/1983 |
| JP | 59219464 A | 12/1984 |
| JP | 61238981 A | 10/1986 |
| JP | 62047132 A | 2/1987 |
| JP | 62277730 A | 12/1987 |
| JP | 63-164433 | 7/1988 |
| JP | 01119025 A | 5/1989 |
| JP | 02106925 A | 4/1990 |
| JP | 06204181 A | 7/1994 |
| JP | 7-500459 | 1/1995 |
| JP | 08-037097 | 2/1996 |
| JP | 08232086 A | 9/1996 |
| JP | 08274069 A | 10/1996 |
| JP | 9-501271 | 2/1997 |
| JP | 09-102625 | 4/1997 |
| JP | 09283493 A | 10/1997 |
| JP | 09320799 A | 12/1997 |
| JP | 10223736 A | 8/1998 |
| JP | 11102880 A | 4/1999 |
| JP | 11317396 A | 11/1999 |
| JP | 2000261008 A | 9/2000 |
| JP | 2001127142 A | 5/2001 |
| JP | 2001-527288 | 12/2001 |
| JP | 2002-076404 | 3/2002 |
| WO | WO 94/05035 | 3/1994 |
| WO | WO 95/13525 | 5/1995 |
| WO | WO 99/33097 | 7/1999 |
| WO | WO 99/56324 | 11/1999 |
| WO | WO 00/26945 | 5/2000 |
| WO | 0209198 A1 | 1/2002 |

OTHER PUBLICATIONS

Japanese language notice of rejection and its English translation for Japanese application No. 2002-311820.

Japanese language notice of rejection and its English translation for Japanese application No. 2002-249671.

German language office action for German application No. 10340751.0-54.

English translation of German Office Action for corresponding German application No. 10340751.0-54 lists the references above.

German language office action and its English language translation for corresponding German application No. 10340750.2-43.

* cited by examiner

METHOD FOR PRODUCING A SOLAR CELL

This application is based on application Nos. 2002-247329, 2002-249673, and 2002-249674 filed in Japan, the content of which is incorporated hereinto by reference.

BACKGROUND OF THE INVENTION

1. Field of the Invention

The present invention relates to method and apparatus for processing a substrate and a plate used therein, and more particularly to method and apparatus for processing a substrate that enable surface roughening on a silicon substrate used in a solar cell or the like, and a plate used therein.

2. Description of the Related Art

A solar cell converts incident light energy into electrical energy. The solar cell is classified into crystal-based, amorphous-based, and compound-based solar cells depending on materials used. Among others, crystalline silicon solar cells account for a large percentage of the solar cells currently available on the market. The crystalline silicon solar cell is further classified into a single-crystalline silicon type and a multi-crystalline silicon type. A silicon solar cell of a single-crystal type has an advantage that efficiency can be readily improved due to the substrate of high quality, but has a drawback that the manufacturing cost of the substrate is high. On the contrary, a multi-crystalline silicon solar cell has a drawback that efficiency cannot be readily improved due to the substrate of inferior quality, but has an advantage that the manufacturing cost is low. In addition, improvement in quality of the multi-crystalline silicon substrate and advancement in the cell fabrication technique in recent years made it possible to achieve conversion efficiency of approximately 18% in the research level.

On the other hand, while multi-crystalline silicon solar cells have been available on the market because they can be manufactured at a low cost through mass-production, the demand is now on the increase due to growing concern about environmental issues in recent years, and there is a need to achieve higher conversion efficiency at a low cost.

There have been made many attempts regarding solar cells to improve conversion efficiency to electrical energy. One of such attempts relates to a technique to reduce reflection of light incident on the substrate, by which conversion efficiency to electrical energy can be improved by reducing reflection of light on the surface.

In a case where a solar cell is fabricated from a silicon substrate, reflection can be reduced to some extent by etching the surface of the substrate with alkaline aqueous solution, such as sodium hydroxide, to form fine textures (concavities and convexities) on the surface of the substrate. In a case where a single-crystalline silicon substrate having a (100)-plane orientation, a group of myriads of pyramids called a texture structure can be formed on the surface of the substrate by the method described above.

Etching with the use of alkaline aqueous solution, however, depends on the plane orientation of crystals, and for this reason, in a case where a solar cell is fabricated from a poly-crystalline silicon substrate, a group of pyramids cannot be formed homogeneously, which raises a problem that overall reflectance cannot be reduced effectively. When the textures cannot be formed homogeneously, incident light cannot be taken into the solar cell effectively, and the solar cell has little hope of improving photoelectrical conversion efficiency.

In order to eliminate such a problem, there has been proposed an idea of texturing the surface by forming fine textures through the reactive ion etching method when a solar cell element is fabricated from multi-crystalline silicon (see Japanese Laid-Open Patent Application No. 102625/1997, etc.). In other words, this idea is to reduce reflectance of a solar cell using multi-crystalline silicon more effectively by forming fine texture homogeneously on multi-crystalline silicon regardless of anomalous plane orientations of the crystals.

A substrate processing apparatus used in the reactive ion etching method is generally of a parallel plate counter-electrode type, wherein an RF voltage plate is provided on the side where the substrate is placed and the electrode on the other side and the internal sidewall are connected to ground. The interior of the chamber is evacuated, then the substrate is added by the RF voltage and is subjected to plasma etching while a constant pressure is maintained by introducing an etching gas, and a pressure in the interior of the chamber is restored to atmospheric pressure after the etching is completed.

Because of the procedure described above, waiting times for evacuation and leaking to atmospheric pressure are long in a reactive ion etching apparatus. Moreover, the area of the solar cell itself is large. Hence, there is a problem that the manufacturing cost of a solar cell is increased because only a small number of substrates can be processed at a time.

Accordingly, in the case of using a reactive ion etching apparatus in the fabrication sequence of a solar cell, a way in which the number of substrates to be processed at a time is increased at high tact while ensuring homogeneity of textures formed the surface of the substrate, or a way in which the area of a substrate to be processed is increased is crucial.

It is therefore an object of the invention to provide the method and apparatus for processing a substrate that make it possible to form textures homogeneously on the surface of a semiconductor substrate, in particular, a substrate used in a solar cell, at high throughput, and a plate used therein.

BRIEF SUMMARY OF THE INVENTION

A substrate processing method of the invention is characterized in that, when a surface of a substrate is roughened through a dry etching method by placing a plate provided with a number of opening portions so as to cover the substrate to be processed, an open area ratio of the opening portions on a peripheral portion side is made smaller than an open area ratio of the opening portions in a central portion when the plate is viewed in a plane. A substrate processing apparatus of the invention is an apparatus used to implement the above substrate processing method, and is characterized in that an open area ratio of the opening portions on a peripheral portion side is made smaller than an open area ratio of the opening portions in a central portion when the plate is viewed in a plane. Also, a plate for use in a substrate processing apparatus of the invention is a plate used in the above substrate processing apparatus, which is characterized in that an open area ratio of the opening portions on a peripheral portion side is made smaller than an open area ratio of the opening portions in a central portion as viewed in a plane.

According to these inventions, by using the plate in which an open area ratio of the opening portions on the peripheral portion side is made smaller than an open area ratio of the opening portions in the central portion, it is possible to form textures (rough surface) on the surface of a silicon substrate or the like efficiently and homogeneously whether the surface is covered by the central portion or the peripheral portion of the plate, and many a substrate can be thus processed at a time. Also, the area of a substrate to be processed can be increased.

A substrate processing method of the invention is characterized in that each opening portion in the plate is of a size such that allows a virtual column having a diameter equal to or less than half a distance between the plate and a surface of a substrate to be processed to pass through the opening portion while inhibiting a virtual column having a diameter greater than half the distance from passing through the opening portion, and the surface of the substrate is textured through a dry etching method with the use of such a plate. A substrate processing apparatus of the invention is an apparatus used to implement the above substrate processing method, wherein each opening portion in the plate is of a size such that allows a virtual column having a diameter equal to or less than half the distance between the plate and the surface of the substrate to be processed to pass through the opening portion while inhibiting a virtual column having a diameter greater than half the distance from passing through the opening portion. Also, a plate of the invention is a plate used in the above substrate processing apparatus, in which each opening portion is of a size such that allows a virtual column having a diameter equal to or less than half the distance between the plate and the surface of the substrate to be processed to pass through the opening portion while inhibiting a virtual column having a diameter greater than half the distance from passing through the opening portion.

According to these inventions, by using the plate provided with opening portions each being of a shape such that allows a virtual column having a diameter equal to or less than half the distance between the plate and the surface of the substrate to be processed to pass through the opening portion while inhibiting a virtual column having a diameter greater than half the distance from passing through the opening portion, it is possible to form textures on the substrate homogeneously without causing any unevenness.

A substrate processing method of the invention is characterized in that, when a surface of a substrate is textured through a dry etching method by placing a plate provided with a number of opening portions so as to cover the substrate to be processed, etching is performed with the use of the plate in which chamfered portions are provided to top and/or bottom corners of the opening portions. A substrate processing apparatus of the invention is an apparatus used to implement the above substrate processing method, and is characterized in that chamfered portions are provided to top and/or bottom corners of the opening portions in the plate. Also, a plate of the invention is used in the above substrate processing apparatus and is characterized in that it is provided with a number of opening portions and chamfered portions are provided to the top and bottom corners of opposing end faces of the opening portions in the plate.

According to these inventions, by providing the chamfered portions to the corners of the opening portions in the plate, it is possible to substantially reduce the thickness of the plate at the end portions of the opening portions. This eliminates conditions under which plasma is destabilized when the thickness of the plate is increased to enhance strength against bending of the plate. Hence, plasma can be stabilized, and as a consequence, etching across a large area can be achieved. It is thus possible to form textures on the surface of a silicon substrate or the like, which are needed for highly efficient solar cells, at high tact and at a low cost.

The following description will describe concrete structures of the invention with reference to the drawings.

DETAILED DESCRIPTION OF THE INVENTION

Figure 1:
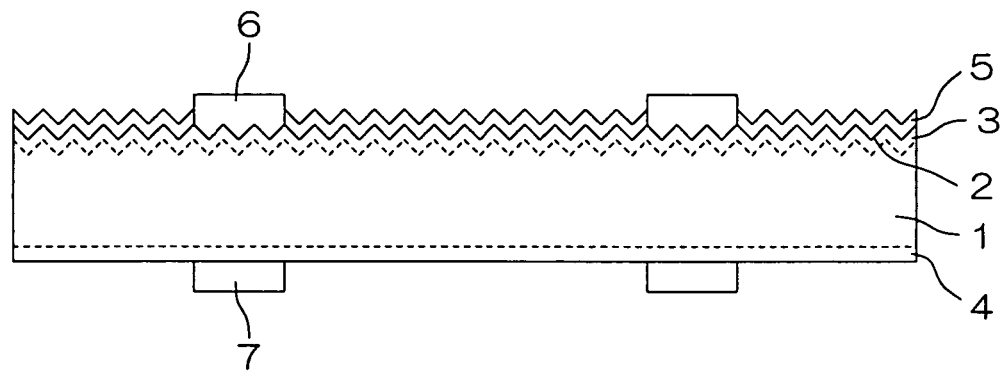
FIG. 1 is a cross section showing a solar cell fabricated through a substrate processing method of the invention.

FIG. 1 is a cross section showing a structure of a solar cell fabricated by a substrate processing method of the invention. Referring to FIG. 1, numeral 1 denotes a silicon substrate, numeral 2 denotes textures formed on the silicon substrate 1, numeral 3 denotes an impurity diffusing layer on the light-reception surface side, numeral 4 denotes an impurity diffusing layer (BSF) on the back surface side of the silicon substrate 1, numeral 5 denotes a surface anti-reflection layer, numeral 6 denotes a surface electrode, and numeral 7 denotes a back surface electrode.

The silicon substrate 1 is a single-crystalline or multi-crystalline silicon substrate. The substrate is either of a p-type or an n-type. The silicon substrate 1 is formed through the Czochralski method or the like in the case of single-crystalline silicon, and through casting process or the like in the case of multi-crystalline silicon. Multi-crystalline silicon is quite advantageous over single-crystalline silicon in terms of the manufacturing costs because it can be mass-produced. An ingot made through the Czochralski method or the casting processing is sliced at a thickness of approximately 300 μm, and cut into a silicon substrate of a size of approximately 10 cm×10 cm or 15 cm×15 cm.

On the surface side of the silicon substrate 1 are formed the impurity diffusing layer 3 in which another type impurity against to the substrate is diffused and the anti-reflection layer 5. It is preferable to form the layer (BSF) 4 in which one conduction type semiconductor impurity is diffused at a high concentration on the back surface side of the silicon substrate 1. The surface electrode 6 and the back surface electrode 7 are formed respectively on the surface side and the back surface side of the silicon substrate 1. The surface electrode 6 and the back surface electrode 7 are formed by sintering screen-printed Ag paste and by forming a solder layer on the top.

The textures 2 are formed as follows. That is, a gas is kept introduced into an evacuated chamber to maintain a constant pressure, and plasma is generated by applying RF voltage to the electrode provided inside the chamber. The surface of the substrate is then etched by the action of resulting activated seeds, such as ions and radicals. This method is referred to as the reactive ion etching (RIE) method, and will now be described with reference to FIG. 2 and FIG. 3.

Figure 2:
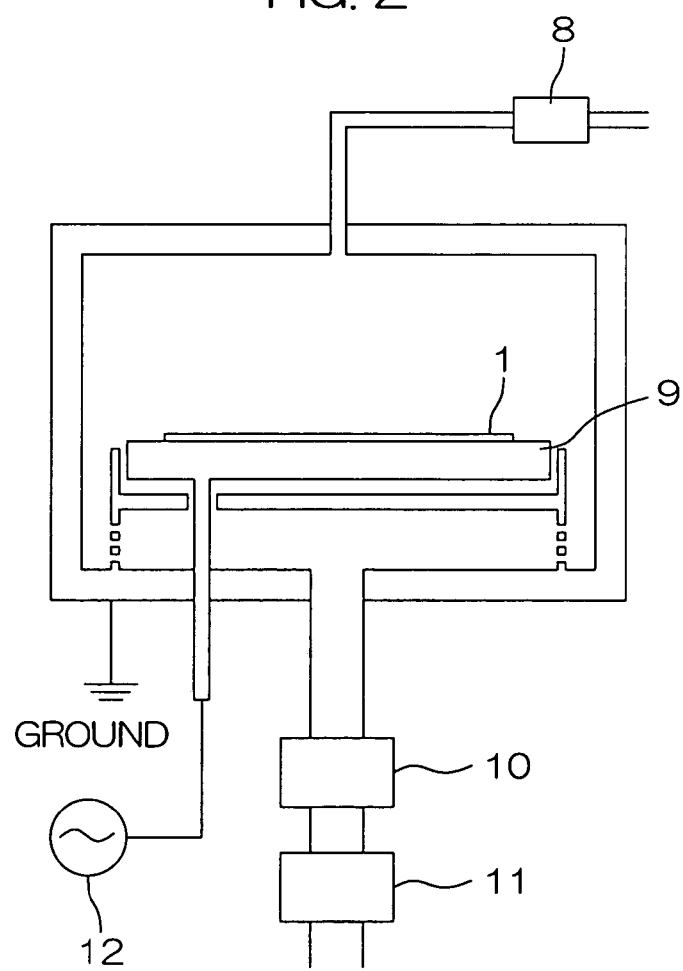
FIG. 2 is an internal cross section showing one example of a substrate processing apparatus of the invention.
Figure 3:
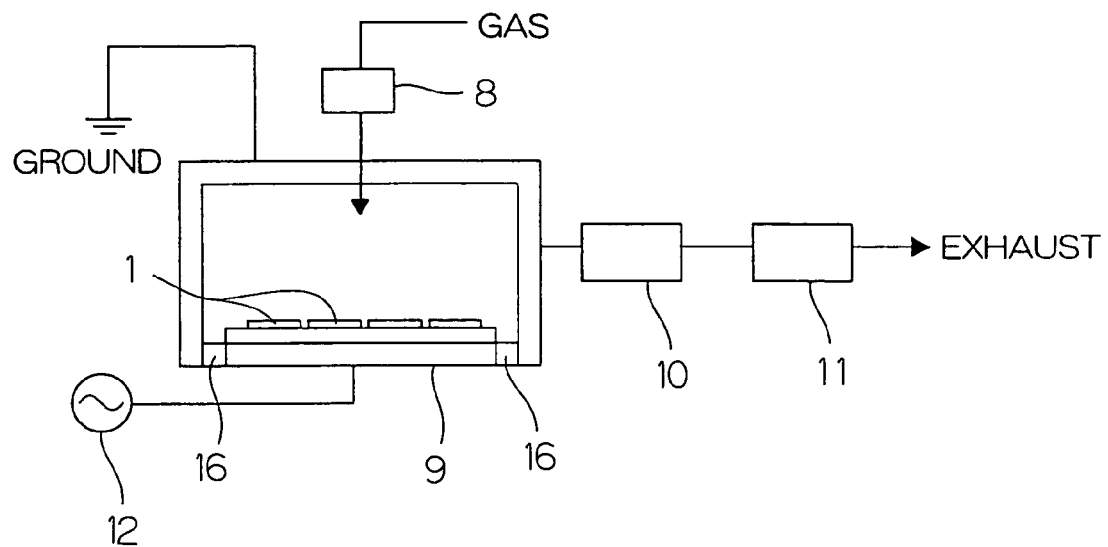
FIG. 3 is an internal cross section showing another example of the substrate processing apparatus.

Referring to FIG. 2 and FIG. 3, numeral 1 denotes a silicon substrate, numeral 8 denotes a massflow controller, numeral 9 denotes an RF electrode, numeral 10 denotes a pressure controller, numeral 11 denotes a vacuum pump, and numeral 12 denotes an RF power supply. Referring to FIG. 3, in particular, numeral 16 denotes an insulation portion that electrically isolates the RF electrode 9 from other outside walls. Plasma is generated by introducing a gas necessary for etching into the apparatus by the massflow controller 8 while supplying RF power from the RF electrode 9 to excite and activate ions and radicals, and the surface of the silicon substrate 1 placed on the top portion of the RF electrode 9 is etched by the action of the ions and radicals. According to the apparatus shown in FIG. 2, the surface of a single large-area silicon substrate 1 is etched by providing the RF electrode 9 inside the apparatus. On the contrary, according to the apparatus shown in FIG. 3, the surfaces of a plurality of silicon substrates 1 are etched concurrently by providing the RF electrode 9 on the outside wall of the apparatus.

A method in which, of all the generated active seeds, the effect of etching by the action of ions is enhanced is generally referred to as the reactive ion etching method. The plasma etching method is known as a similar method. The reactive ion etching method and the plasma etching method are basically the same in the principle of generating plasma, and different merely in distributions of the kinds of active seeds acting on the substrate, and the distributions are changed depending on the chamber structure, the electrode structure, a generation frequency or the like. The invention, therefore, is effective not only to the reactive ion etching method, but also to the plasma etching method in general.

In this invention, for example, etching is performed for approximately three minutes at a reaction pressure of 7 Pa and at plasma-generating RF power of 500 W while 20 sccm of methane trifluoride ($CHF_3$), 50 sccm of chlorine ($Cl_2$), 10 sccm of oxygen ($O_2$), and 80 sccm of sulfur hexafluoride ($SF_6$) are kept flown. The textures 2 are thereby formed on the surface of the silicon substrate 1. Basically, silicon evaporates when it is etched, part of which, however, does not evaporate completely and molecules bond to one another, thereby being left as residues on the surfaces of the substrate 1. In other words, in the invention, when the surface of the silicon substrate 1 is roughened through the reactive ion etching method and a similar dry etching method, a rate at which etching residues, chiefly composed of etched silicon, re-attach to the surface of the silicon substrate 1 is accelerated, so that the textures 2 are formed on the surface of the silicon substrate 1 by using the residues as a micro-mask for etching. It should be noted that the etching residues are removed in the end.

Also, the textures 2 can be formed in a reliable manner by setting a gas condition, a reaction pressure, RF power, etc. to comply with the conditions such that the etching residues of silicon will be left on the surface of the silicon substrate 1. It should be noted, however, that an aspect ratio of the textures 2 needs to be optimized. Conversely, it is difficult to form the textures 2 under condition that the etching residues will not be left on the surface of the silicon substrate 1.

Figure 4:
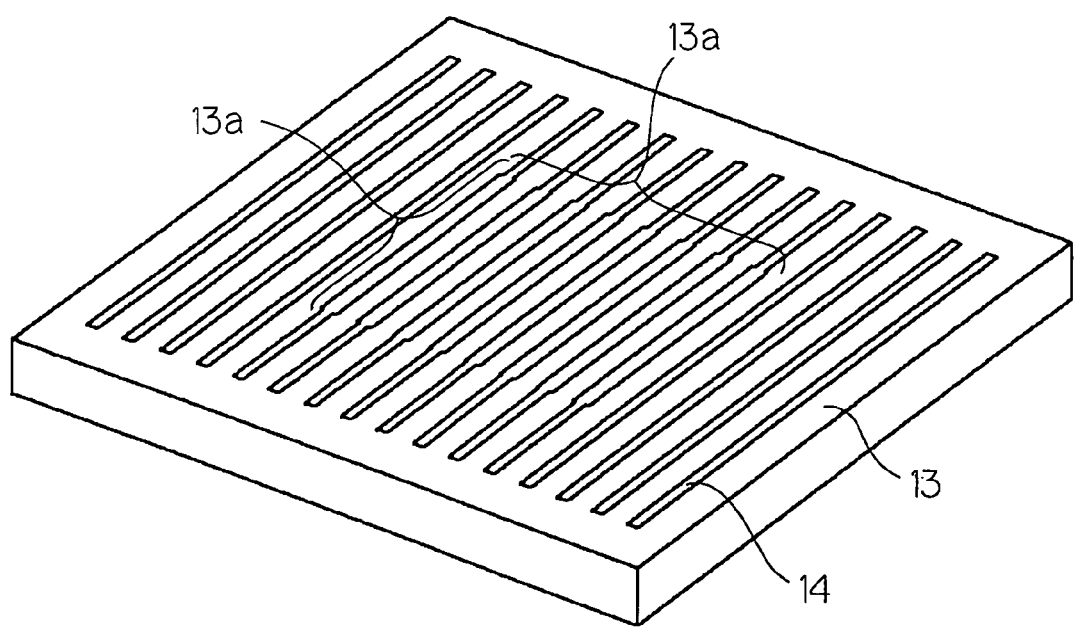
FIG. 4 is a perspective view showing a plate of the invention.

According to the invention, as shown in FIG. 4, the silicon substrate 1 is subjected to etching while being covered with a plate 13 provided with a number of opening portions 14 across the whole area. Generation of the etching residues is promoted with the use of such a plate 13, which in turn promotes the formation of the textures 2.

FIG. 4 shows one example of the plate 13. The plate 13 is made of aluminum or glass. When the readiness in processing is concerned, metal is preferable as a material of the plate 13; however, stainless or the like is not suitable because it corrodes when exposed to a gas used to etch silicon. On the other hand, the plate 13 generates heat because it is exposed to plasma during etching. Although the extent of rise in temperature varies greatly with the conditions, because the temperature of the plate 13 rises when it is exposed to plasma and the silicon substrate 1 is allowed to stand in atmosphere when etching ends, a material that can withstand a temperature change is preferred. It is therefore preferable to use a glass material when the plate 13 is exposed to plasma.

On the other hand, in a case where a number of substrates to be etched are aligned and etching is performed across a large area at a time, it is preferable to use metal because a glass material is so brittle that it readily breaks. Considering the processing performance such that allows various kinds of processing on the plate 13, and a small self-weight desired to reduce distortion of the plate 13 as well as corrosion resistance to a gas used for etching, it is particularly preferable to use a plate 13 made of aluminum.

Figure 5:
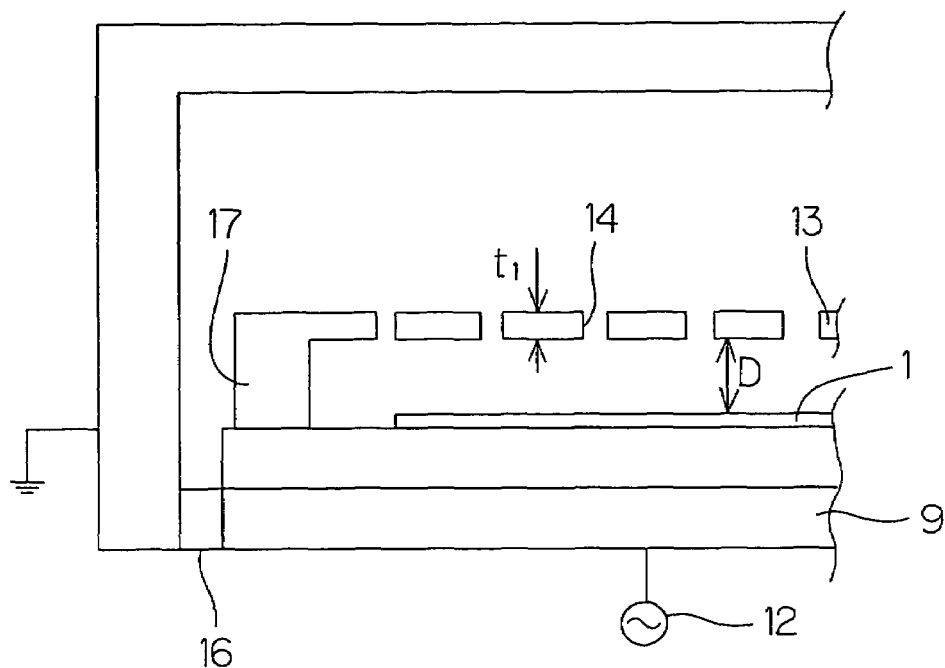
FIG. 5 is a partially enlarged cross section of the substrate processing apparatus of FIG. 3.

It is preferable to perform etching while the plate 13 and the silicon substrate 1 are held to be spaced apart by a predetermined distance D (see FIG. 5). Herein, D=5 to 30 mm. When arranged in this manner, silicon compounds produced during etching can be trapped in a space between the silicon substrate 1 and the plate 13, which makes it easier for residues chiefly composed of silicon to be generated on the substrate 1. Hence, not only the generation of residues, but also the formation of the textures 2 can be promoted. When the distance D between the plate 13 and the silicon substrate 1 is less than 5 mm, the opening portions 14 in the plate 13 are transferred as a pattern on the surface of the silicon substrate 1 when the textures 2 are formed, thereby leaving unevenness on the surface. Conversely, when the distance D is greater 30 mm, the effect of generating the residues faster to promote formation of the textures 2 is reduced.

A method of holding the plate 13 and the silicon substrate 1 to be spaced apart by a predetermined distance is not especially limited. As shown in FIG. 5, for example, it is simple to provide a sidewall 17 along the peripheral edge portion on the back surface side of the plate 13. In a case where a number of silicon substrates 1 are to be etched and the plate 13 of a large area is needed, the plate 13 may fall down at the center due to self-weight, and a distance between the substrate 1 and the plate 13 may be shortened. Then, traces of the opening portions 14 may possibly be transferred onto the silicon substrate 1 and left as unevenness. In such a case, effective countermeasures are to increase a thickness t1 of the plate 13 to improve rigidity or to increase the height of the sidewall 17. A method of reducing the thickness and thereby the weight of the plate 13 at the center is also effective. The thickness t1 of the plate 13 can be set in relation with the strength, material costs, etching conditions, etc.

A problem when the thickness t1 of the plate 13 is increased is that plasma is destabilized in the regions of the respective opening portions 14, and the textures 2 can no longer be formed when plasma becomes too unstable. A measure to solve this problem will be described below with reference to FIG. 9.

It is also preferable that a ratio of the opening portions 14 with respect to the entire area of the plate 13 (hereinafter, referred to as the open area ratio) as viewed in a plane is set to approximately 5 to 40%. When the open area ratio is less than 5%, a gas needed to etch the silicon substrate 1 is not supplied sufficiently, and a residue forming rate is reduced, which in turn slows down the formation of the textures 2. Conversely, when the open area ratio is greater than 40%, the effect of trapping evaporating silicon compounds in a space between the plate 13 and the silicon substrate 1 is reduced, and so is the effect of promoting the formation of the residues.

In the invention, the distribution of the open area ratios is reduced on the peripheral portion side in comparison with the central portion of the plate 13. For example, 20% is given as the open area ratio in the central portion and 18% is given as the open area ratio on the peripheral portion side. The advantages achieved from this arrangement will be explained in the following.

Generally, a small open area ratio makes a supply of a gas insufficient, and thereby lowers the etching rate. Conversely, a large open area ratio makes a supply of a gas sufficient but makes adhesion of residues to the surface of the silicon substrate 1 insufficient. Hence, because a mask is formed slowly, an texturing rate is reduced.

In particular, in the case of dry etching using plasma, it is necessary, as one of the factors to form the textures 2, to accelerate plasma-induced charge-carrying ions using the electrical field, so that they are incident on the surface of the substrate 1 in a perpendicular direction. Experiments reveal that the formation of the textures 2 is fast in the central portion, but a quantity of etching on the peripheral portion is greater than or nearly equal to that in the central portion. In view of the foregoing, it is thought that a gas sufficient to etch the substrate 1 is supplied on the peripheral portion side; however, efficiency of ions incident on the substrate 1 is small compared with the central portion.

On the other hand, as another factor to form the textures 2 faster, there is a method of forming the etching residues faster. By accelerating the formation of the residues, the textures 2 can be formed faster, too. This can be achieved by narrowing the opening portions 14 in the plate 13. It should be noted, however, that a quantity of etching is reduced in this case because a less quantity of gas is supplied.

Figure 6:
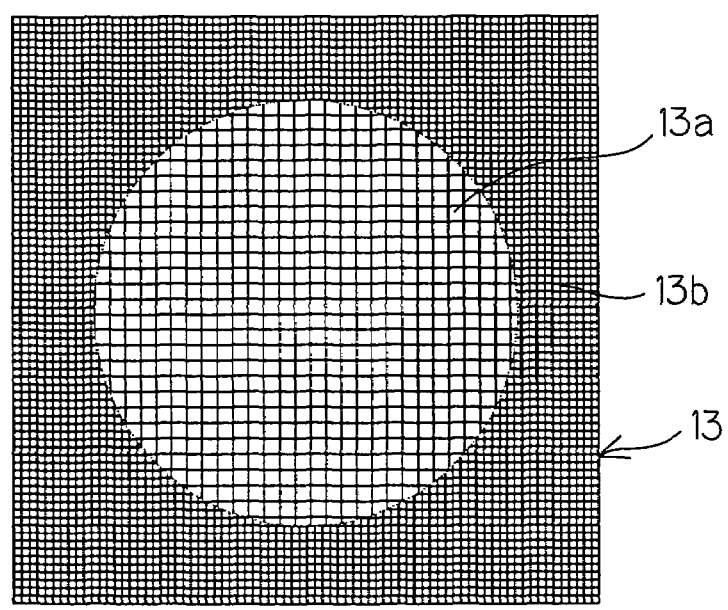
FIG. 6 is a plane view showing a distribution of open area ratios across the plate.
Figure 7:
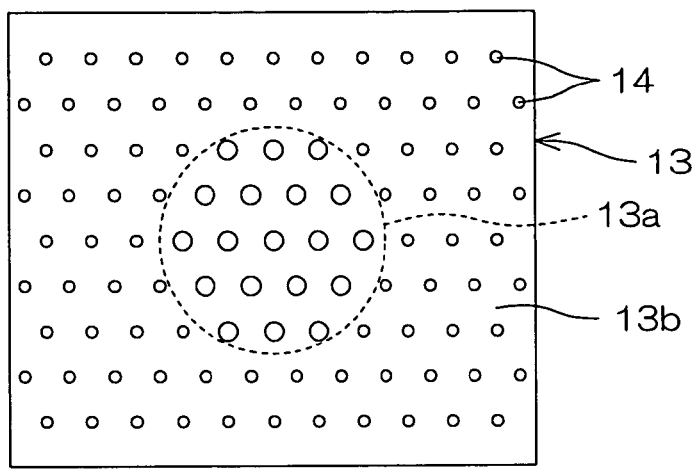
FIG. 7 is a plane view showing another example of the plate.

Thus, in the invention, the foregoing arrangements are combined, and as shown in FIG. 6 and FIG. 7, an open area ratio of the opening portions 14 in the peripheral portion 13b is made smaller than an open area ratio of the opening portions 14 in the central portion 13a, so that a texturing rate in the peripheral portion 13b is accelerated to be almost as high as a texturing rate in the central portion 13a. The central portion 13a illustrated in FIG. 6 and FIG. 7 is of a circular shape. However, the shape of the central portion 13a is not limited to a circle, and the central portion 13a can be of an elliptic or polygonal shape. In FIG. 4, the central region 13a having a large open area ratio is shaped like a rectangle.

The invention is particularly effective when adapted to a large-scaled apparatus used to etch an area greater than 1 m$^2$, but the invention is effective as well when adapted to an apparatus used to etch a small area. Also, the method of the invention is particularly effective when there is a structural problem such that the homogeneity cannot be improved sufficiently by changing the other etching conditions.

The shape of the opening portions 14 in the plate 13 is not especially limited. For example, an elongate slit pattern as shown in FIG. 4 maybe used. Alternatively, dot-shaped small holes may be aligned in a zigzag pattern as shown in FIG. 7 or a grid pattern as shown FIG. 6 may be employed. It should be noted, however, that the widespread presence of non-opening regions causes unevenness in the shape of textures 2.

These fine textures 2 are of a cone shape or a shape of an array of cones, and the size thereof can be changed by controlling a gas concentration or an etching time by the RIE method. Both the width and the height of the textures 2 are 2 µm or less. In order to form the textures 2 across a necessary portion on the silicon substrate 1 homogeneously and with the exact control capability, it is preferable to set the width and the height to 1 µm or less. It is also preferable that an aspect ratio of the textures 2 (height/width of textures 2) is 2 or less. When the aspect ratio is greater than 2, the textures 2 break during the fabrication. A solar cell fabricated from such a substrate causes a large leak current and cannot achieve a satisfactory output characteristic.

After the textures 2 are formed, the etching residues left on the surface of the silicon substrate 1 are removed to improve the characteristic of the solar cell. A method of removing the etching residues may be, for example, to apply ultrasound wave to the silicon substrate 1 pulled out from the reactive ion etching apparatus or a similar plasma etching apparatus within a water bath. Commercially available ultrasonic cleaners use frequencies ranging from tens kHz to a few hundreds kHz, and transducers used to apply ultrasound wave differ in materials, shapes, outputs, etc. However, the type of the cleaner can be chosen depending on the readiness of removing the residues on the surface. The readiness of removing the residues varies with the shape and the size of the textures 2, a quantity of remaining residues, a thickness of the silicon substrate, etc., as well as with the frequency of ultrasound. However, even under the conditions that the removal of the residues is relatively difficult, the residues can be removed by extending an application time.

As has been described, the pattern of the opening portions 14 is not especially limited; however, a repetitive pattern, such as a dot shape and a slit shape, is preferable to prevent the pattern from becoming too complicated. Nevertheless, even when the plate 13 and the substrate 1 are placed oppositely as described above, the occurrence of unevenness in the textures 2 formed on the surface of the substrate 1 was confirmed when the relation between the distance D from the substrate 1 to the plate 13 and the size and the shape of the opening portions 14 was inappropriate. To be more specific, even when an overall open area ratio is 5 to 40%, if an open area ratio per unit area in a specific local region is 70%, then the textures 2 formed under this specific local region causes unevenness in comparison with the textures 2 formed under the other portions.

Also, unevenness caused by the opening portions 14 is closely related to the distance D between the plate 13 and the silicon substrate 1, and the shorter the distance D, the more readily the unevenness occurs.

In regard to the size of the opening portion 14, it is revealed that even when an overall open area ratio is the same, unevenness readily occurs when the individual opening portions 14 are large in comparison with a case when the individual opening portions 14 are small.

It is understood from detailed examinations of the foregoing relations that unevenness occurs readily when the shape pattern of the respective opening portions 14 is of a size equal to or greater than a specific reference size. That is, it is understood that the size of the opening portions 14 is determined by the distance D between the plate 13 and the surface of the substrate 1 to be processed, and unevenness readily occurs when the opening portions 14 are of a size large enough for a virtual column having a diameter greater than half the distance D between the plate 13 and the surface of the substrate 1 to be processed to pass through the opening portions 14.

Thus, the invention is characterized in that, in the substrate processing method of roughening the surface through the dry etching method by placing the plate 13 provided with a number of opening portions 14 on the surface side of the substrate 1 to be processed, the respective opening portions 14 in the plate 13 are of a size such that allows a virtual column having a diameter equal to or less than half the distance D between the plate 13 and the surface of the substrate 1 to be processed to pass through the opening portions 14, but inhibits a virtual column having a diameter greater than half the distance D from passing through the opening portions 14.

Figure 8:
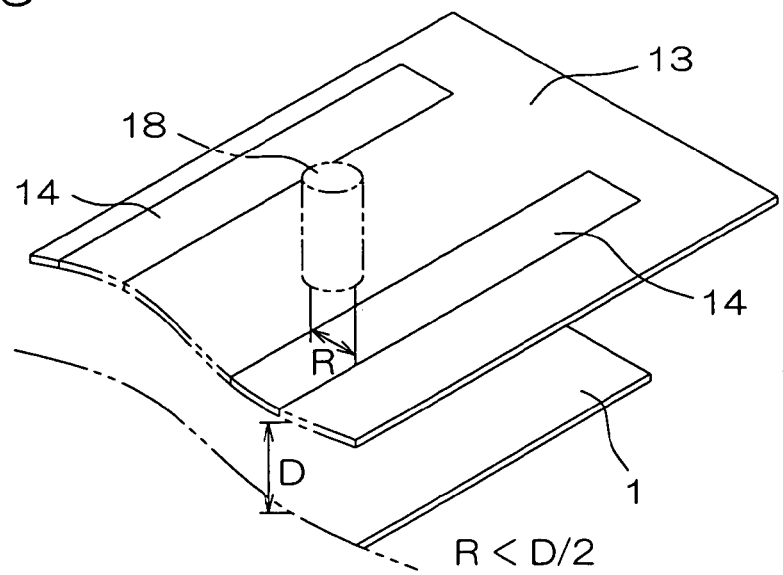
FIG. 8 is a view used to explain the limit of a size of the opening portions in the plate.

FIG. 8 is a conceptual view used to explain the conditions of the opening portions 14. Referring to FIG. 8, numeral 18 denotes a virtual column. By forming the opening portions 14 so that a diameter R of the largest virtual column 18 allowed to pass through the opening portion 14 is equal to or less than half the distance D between the plate 13 and the silicon substrate 1, it is possible to form the textures 2 having no unevenness.

The shape of the opening portions 14 is not especially limited. For example, it may be a slit-shaped pattern as shown in FIG. 4, or it may be a dot-shaped zigzag pattern as shown in FIG. 7. It should be noted, however, that the widespread presence of non-opening regions readily causes unevenness in the pattern of the textures 2.

Figure 9:
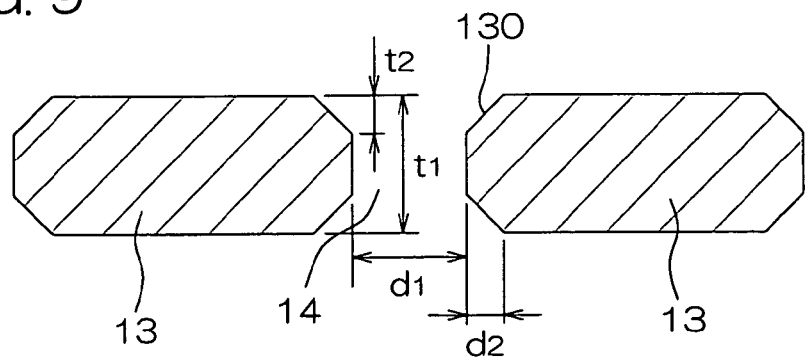
FIG. 9 is an enlarged cross section in part of the plate used to explain a cross-sectional shape of the opening portion.

A longitudinal cross-sectional shape, in particular, an effective longitudinal cross-sectional shape, of the opening portions 14 in the plate 13 will now be explained with reference to FIG. 9.

When the plate 13 of a large area is manufactured, the plate 13 bends due to its self-weight. Also, because plasma used for etching heats the plate 13, and the plate 13 may further deform due to self-weight. The larger the area of the silicon substrate 1, the more difficult it becomes to control exactly a distance between the silicon substrate 1 and the plate 13. Such an unwanted event can be eliminated by increasing the rigidity by increasing the thickness of the plate 13 as described above. However, when the thickness of the plate 13 is increased, plasma is destabilized in the regions of the respective opening portions 14, which raises a problem that the textures 2 can no longer be formed when plasma becomes too unstable. For example, given 3 mm as a distance between the opposing end faces of the opening portions 14 in the plate 13, then plasma remains stable when the thickness is 5 mm or less; however, when the thickness exceeds 5 mm, plasma is destabilized and efficiency of forming the textures 2 on the substrate 1 is deteriorated.

An effective measure to prevent plasma from being destabilized is to enlarge the opening width between the opposing end faces of the opening portions 14. However, when the opening width between the opposing end faces of the opening portions 14 is increased, the residue trapping effect is reduced. The effect of promoting the formation of residues on the surface of the substrate 1 directly below is then reduced, which in turn slows down the formation of the textures 2. The formation of the textures 2 in this particular portion is thereby slowed down, and this gives rise to a difference in the texturing rates on the surface of the substrate 1 between portions where the opening portions 14 are present and absent, which results in unevenness.

The opening width of the opening portions 14 is originally set in such a manner that the textures 2 will be formed more efficiently by giving considerations to the opening shape, an open area ratio, and opening pitches of the overall plate 13, a distance between the plate 13 and the substrate 1 to be etched, etc. Hence, controlling the opening width of the opening portions 14 with the aim to stabilize plasma may result in a failure to achieve the original object, and is by no means an ultimate solution.

The inventor therefore devised a longitudinal cross-sectional shape of the opening portions 14. FIG. 9 is an enlarged cross section when elongate slit-shaped opening portions 14 are made in the plate 13. As shown in FIG. 9, the top and/or bottom corners of each opening portion 14 are chamfered to provide chamfered portions 130. This arrangement can reduce the thickness of the plate 13 apparently in the vicinity of the opening portions 14 where plasma is readily destabilized, and plasma can be thus generated stably. In the example described above, given 3 mm as the opening width $d_1$ of the opening portion 14 and 6 mm as the thickness $t_1$ of the plate 13 made of aluminum, then an edge surface having a width $d_2$ and a height $t_2$ of 0.9 mm or greater is formed in each chamfered portion 130. The width $d_2$ and the height $t_2$ of the chamfered portion 130 vary depending on the etching conditions, and can be set as needed to comply with the respective conditions. It is therefore understood that the invention is not limited to the values specified above.

Figure 10A:
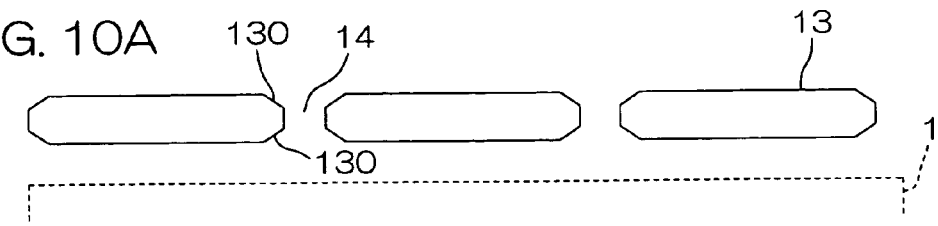
FIGS. 10A to 10F are sectional views showing various chamfered shapes formed on the opening portion.
Figure 10B:
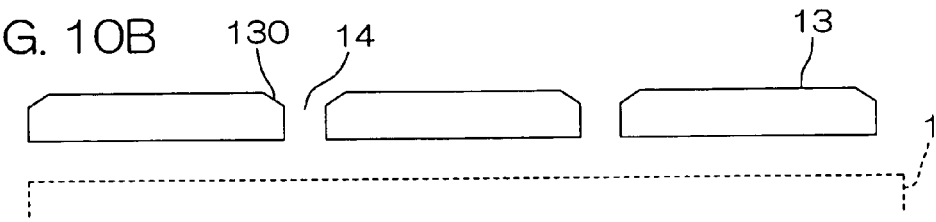
Figure 10C:
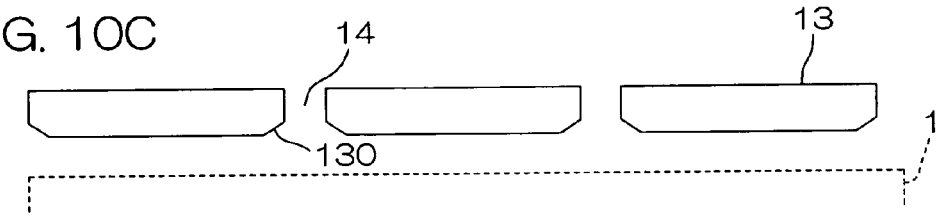

The chamfered portion 130 may be formed on both the side exposed to the substrate 1 and the back side to the substrate 1 as shown in FIG. 10A, may be formed on only the back side to the substrate 1 as shown in FIG. 10B, and may be formed on only the side exposed to the substrate 1 as shown in FIG. 10C.

Figure 10D:
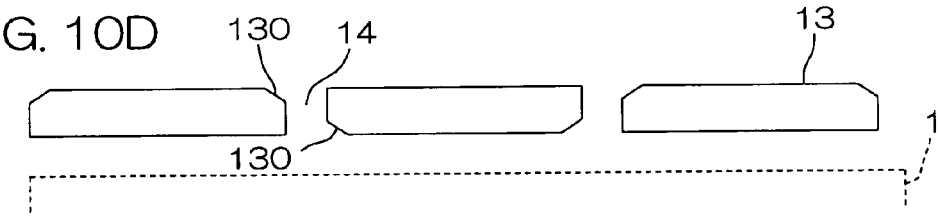
Figure 10E:
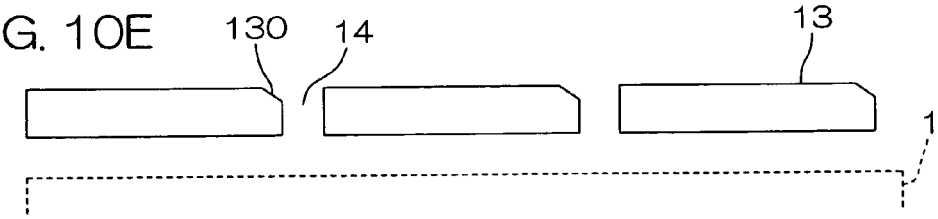
Figure 10F:
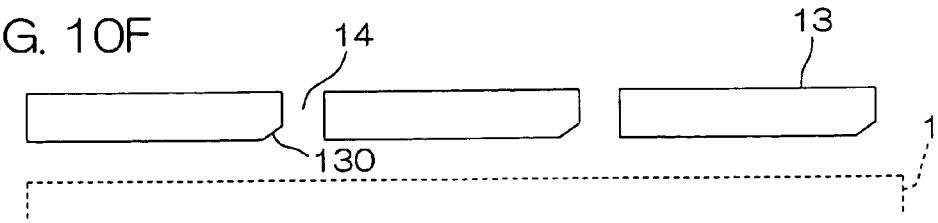

Further, the chamfered portion 130 may not be formed on the whole periphery of the opening portion 14. As shown in FIGS. 10D to 10F, the chamfered portion 130 does not exist on a part of the opening portion 14. FIG. 10D shows a configuration where the chamfered portion 130 is provided on left-upper and right-down side of a opening portion 14, and the chamfered portion 130 is provided on right-upper and left-down side of a next opening portion 14.

FIG. 10E shows a configuration where the chamfered portion 130 is formed only on the left-upper side of the opening portion 14. FIG. 10F shows a configuration where the chamfered portion 130 is formed only on the left-down side of the opening portion 14.

These chamfered portions 130 can be formed by chamfering processing. When the chamfered portion is formed only one up or down side of the opening portion 14, it can be formed simultaneously with forming the opening portion 14.

Also, a rounded surface may be provided as the chamfered portion 130. In any case, the chamfered portions 130 of the opening portion 14 only have to reduce the thickness of the plate 13 apparently. In the example above, the opening portions 14 are shaped like a slit. However, the opening portions 14 may be of a circular shape or a rectangular shape. Also, the opening pattern may be a grid pattern (see FIG. 6), a zigzag pattern (see FIG. 7) or the like.

While the substrate processing method of the invention has been described by using a bulk silicon solar cell as an example, the invention is applicable to surface roughening of a wide range of substrates used in a substrate thin-film silicon solar cell, a super straight solar cell, an amorphous silicon solar cell, a compound-based thin-film solar cell, etc. Moreover, the invention is applicable to surface roughening of a substrate used in a tandem thin-film solar cell or the like. In addition, the substrate 1 to be etched is not limited to a silicon substrate, and it maybe a substrate made of glass, metal, plastic, resin, etc. The substrate 1 is not limited to a plate, either, and it may be a film member. It goes without saying that the invention can be modified in various manners without departing from the scope of the invention.

The invention claimed is:

1. A method for producing a solar cell comprising:
   placing a substrate for a solar cell on an RF electrode in a chamber;
   placing a plate to cover the substrate, the plate being provided with a number of opening portions in a central region thereof and a number of opening portions in a peripheral region surrounding the central region thereof, an open area ratio of the opening portions in the peripheral region being smaller than an open area ratio of the opening portions in the central region; and forming fine textures on a surface of the substrate by using residues chiefly comprising components of the substrate as an etching mask.

2. The method for producing a solar cell according to claim 1, wherein:
the plate is placed to be spaced apart from the surface of the substrate by 5 to 30 mm.

3. The method for producing a solar cell according to claim 1, wherein:
the substrate is a plate or a film member made of one material selected from silicon, glass, metal, plastic, and resin.

4. The method for producing a solar cell according to claim 1, wherein:
the fine textures are fabricated by a reactive ion etching method.

5. The method for producing a solar cell according to claim 1, wherein the central region of the plate is opposed to a central region of the substrate, and the peripheral region of the plate is opposed to a peripheral region of the substrate.

6. The method for producing a solar cell according to claim 1, comprising introducing a gas in the chamber; and
applying an RF power supply to said RF electrode.

7. The method for producing a solar cell according to claim 6, wherein
the fine textures are fabricated by a reactive ion etching method.

8. A method for producing a solar cell comprising:
placing a substrate for a solar cell on an RF electrode in a chamber;
placing a plate to cover the substrate while securing a distance from the surface of said substrate, the plate being provided with a number of opening portions, each opening portion being of a size such that allows a virtual column having a diameter equal to or less than half (½) the distance to pass through the opening portion while inhibiting a virtual column having a diameter greater than half the distance from passing through the opening portion; and
forming fine textures on a surface of the substrate by using residues chiefly comprising components of the substrate as an etching mask.

9. The method for producing a solar cell according to claim 8, wherein:
the plate is placed to be spaced apart from the surface of the substrate by 5 to 30 mm.

10. The method for producing a solar cell according to claim 8, wherein:
the fine textures are fabricated by a reactive ion etching method.

11. The method for producing a solar cell according to claim 8, comprising introducing a gas in the chamber; and
applying an RF power supply to said RF electrode.

12. A method for producing a solar cell comprising:
placing a substrate for a solar cell on an RF electrode in a chamber;
placing a plate to cover the substrate, said plate being provided with a number of opening portions, chamfered portions being provided to the top and bottom corners of the opening portions, wherein said plate is not in direct contact with said substrate;
forming fine textures on a surface of the substrate by using residues chiefly comprising components of the substrate as an etching mask.

13. The method for producing a solar cell according to claim 12, comprising
introducing a gas in the chamber; and
applying an RF power supply to said RF electrode.

14. A method for producing a solar cell comprising:
placing a substrate for a solar cell on an RF electrode in a chamber;
placing a plate to cover the substrate, the plate being provided with a number of opening portions in a central region thereof and a number of opening portions in a peripheral region surrounding the central region thereof, an open area ratio of the opening portions in the peripheral region being smaller than an open area ratio of the opening portions in the central region;
wherein a number of residues are formed by an etching of the substrate during an RF power applying, wherein the residues are trapped in a space between the substrate and the plate.

15. The method for producing a solar cell according to claim 14, wherein:
the plate is placed to be spaced apart from the surface of the substrate by 5 to 30 mm.

16. The method for producing a solar cell according to claim 14, wherein:
the substrate is a plate or a film member made of one material selected from silicon, glass, metal, plastic and resin.

17. The method for producing a solar cell according to claim 14, wherein
the fine textures are fabricated by a reactive ion etching method.

18. A method for producing a solar cell comprising:
placing a substrate for a solar cell on an RF electrode in a chamber;
placing a plate to cover the substrate, the plate being provided with a number of opening portions in a central region thereof and a number of opening portions in a peripheral region surrounding the central region thereof, an open area ratio of the opening portions in the peripheral region being smaller than an open area ratio of the opening portions in the central region;
wherein a number of residues are formed by an etching of the substrate during an RF power applying, wherein the residues are attached to the surface of the substrate.

19. The method for producing a solar cell according to claim 18, wherein
the plate is placed to be spaced apart from the surface of the substrate by 5 to 30 mm.

20. The method for producing a solar cell according to claim 18, wherein
the substrate is a plate or a film member made of one material selected from silicon, glass, metal, plastic and resin.

* * * * *